(12) United States Patent
Kornilovich

(10) Patent No.: US 7,135,057 B2
(45) Date of Patent: Nov. 14, 2006

(54) GAS STORAGE MEDIUM AND METHODS

(75) Inventor: Pavel Kornilovich, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 538 days.

(21) Appl. No.: 10/417,688

(22) Filed: Apr. 16, 2003

(65) Prior Publication Data

US 2004/0209144 A1 Oct. 21, 2004

(51) Int. Cl.
*C01B 3/00* (2006.01)
*B01J 20/22* (2006.01)
*F17C 11/00* (2006.01)

(52) U.S. Cl. .................. 95/90; 427/115; 427/255.11; 428/378; 428/401; 502/526

(58) Field of Classification Search ........... 427/255.11, 427/115, 301; 428/375, 378, 401; 95/90, 95/116, 900; 96/108, 154; 502/526, 407; 206/0.7; 429/12
See application file for complete search history.

(56) References Cited

U.S. PATENT DOCUMENTS

| | | | |
|---|---|---|---|
| 6,331,329 | B1 | 12/2001 | McCarthy et al. |
| 6,358,613 | B1 | 3/2002 | Buriak |
| 6,481,217 | B1 | 11/2002 | Okazaki et al. |
| 6,524,655 | B1 | 2/2003 | McCarthy et al. |
| 6,676,159 | B1 * | 1/2004 | Sellergren .................. 280/783 |
| 6,890,505 | B1 * | 5/2005 | Miyazawa et al. ....... 423/447.2 |
| 2002/0096048 | A1 * | 7/2002 | Cooper et al. ................ 95/116 |
| 2002/0151556 | A1 | 10/2002 | Fenniri |
| 2002/0172820 | A1 * | 11/2002 | Majumdar et al. .......... 428/357 |
| 2003/0008772 | A1 * | 1/2003 | Ma et al. ..................... 502/180 |
| 2003/0167778 | A1 * | 9/2003 | Bradley et al. .............. 62/46.1 |

FOREIGN PATENT DOCUMENTS

| | | |
|---|---|---|
| WO | WO 99/37409 A1 | 7/1999 |
| WO | WO 00/26019 A1 | 5/2000 |
| WO | WO02/48701 A2 | 6/2002 |

OTHER PUBLICATIONS

Boul et al.; "Reversible sidewall functionalization of buckytubes"; Chemical Physics Letters; North-Holland; Amsterdam, NL; vol. 310; Sep. 3, 1999; pp. 367-372.
Yi Cui et al.; "Nanowire nanosensors for highly sensitive and selective detection of biological and chemical species"; American Assoc. for the Advancement of Science; Aug. 17, 2001.
Walter et al.; "Electronic devices from electrodeposited metal nanowires"; Microelectronic Engineering; Elsevier Publishers BV; Amsterdam, NL; vol. 61-62; Jul. 2002; pp. 555-561.
International Search Report for PCT Application No. PCT/US2004/011910, filed Apr. 14, 2004, Hewlett-Packard Company, Search Report completed on Feb. 11, 2005.
Article from Science Magazine, 10.1126/science.1084940, "Enhanced: Molecular Fuel Tanks", Michael D. Ward, 9 pgs.
Renker et al., "Excitation spectrum of hydrogen adsorbed to carbon nanotubes," arXiv:cond-mat/0301266 v. 1 (Jan. 15, 2003) http://arxiv_org/PS_cache/cond-mat/pdf/0301/0301266.pdf.

(Continued)

*Primary Examiner*—Frank M. Lawrence

(57) ABSTRACT

A storage medium for gas molecules has a nanowire core and a number of organic molecules attached to the exterior surface of the nanowire. The organic molecules attached to the exterior of the nanowire are adapted to releasably hold gas molecules. Methods for making and using the invention, including the use of a silicon nanowire, are disclosed.

20 Claims, 1 Drawing Sheet

OTHER PUBLICATIONS

Buriak "Organometallic Chemistry on Silicon and Germanium Surfaces" Chem. Reviews, V. 102 No. 5 (May 2002) pp. 1271-1308.

Schlapbach et al., "Hydrogen-storage materials for mobile applications" Nature, v. 414 (Nov. 15, 2001) pp. 353-358.

Dillon et al., "Carbon Nanotube Materials for Hydrogen Storage" Proceedings of the 2000 DOE/NREL Hydrogen Program Review (May 8-10, 2000).

Pettersson et al. "Hydrogen storage alternatives—a technological and economic assessment" KFB-Meddelande (Stockholm) Dec. 1999.

Buriak "Organometallic chemistry on silicon surfaces: formation of functional monolayers bound through Si-C bonds" Chem Commun (1999) pp. 1051-1060.

Dillon et al., "Optimization of Single-Wall Nanotube Synthesis for Hydrogen Storage," Metal Hydrides and Carbon for Hydrogen Storage Task of the International Energy Agency (IEA) Hydrogen Program, NREL/NN-HYD-0094t; Oct. 2001.

* cited by examiner

GAS STORAGE MEDIUM AND METHODS

TECHNICAL FIELD

This invention relates to storage of gas molecules and more particularly to a gas storage medium using functionalized nanowire cores with organic molecules attached to the exterior surface of the nanowire cores for physisorption of gas molecules.

BACKGROUND

Several recent developments related to energy production and utilization have created increased need for storage of gases, especially efficient means of storing neutral hydrogen with high storage density. Such high storage density of hydrogen is required for effective functioning of fuel cells and is also important for other increasing uses of hydrogen gas in the national economy and in the world economy.

There are several ways to store neutral hydrogen at relatively high densities: tanks of compressed gas, dewars of liquid hydrogen, chambers containing metal hydrides, and others. Metal hydrides, while useful, have a problem of undesirable weight. The liquid form of hydrogen requires maintenance of very low temperatures. Storage of compressed gas uses high pressures. Thus, no ideal method is available at present, and development of alternative methods is desirable.

Physisorption of gas molecules on a solid surface is another phenomenon that may be exploited for gas storage. For that purpose, materials and media with large surface-to-volume ratios are required. Various media have been tried, including glass spheres and carbon nanotubes. While such media have performed the desired function, there is an ongoing need for gas storage media which have increased surface-to-volume ratios and gas storage capacity for neutral hydrogen and for other gas molecules.

BRIEF DESCRIPTION OF THE DRAWINGS

The features and advantages of the disclosure will be readily appreciated by persons skilled in the art from the following detailed description when read in conjunction with the drawings, wherein.

DETAILED DESCRIPTION OF EMBODIMENTS

Throughout this specification and the appended claims, the prefix "nano-" refers to the scale of structures having dimensions of less than about one micrometer, and the term "nanowire" denotes an elongate structure having a diameter less than about one micrometer. Such elongate nanoscale structures may include generally cylindrical structures, wires, rods, filaments, needles, acicular crystals, tubes such as carbon nanotubes, and the like. The following paragraphs describe various embodiments of gas storage media and methods for making and using them.

In accordance with one aspect of the invention, a storage medium for gas molecules has a nanowire core and a number of organic molecules attached to the exterior surface of the nanowire. The organic molecules attached to the exterior of the nanowire are adapted to releasably hold gas molecules.

In accordance with a related aspect of the invention, the nanowire core may be a silicon nanowire, for example, functionalized by attachment of organic molecules suitable for storage of gas molecules such as hydrogen gas molecules. A specific embodiment described below is a hydrogen storage medium based on functionalized silicon nanowires.

Figure 1:
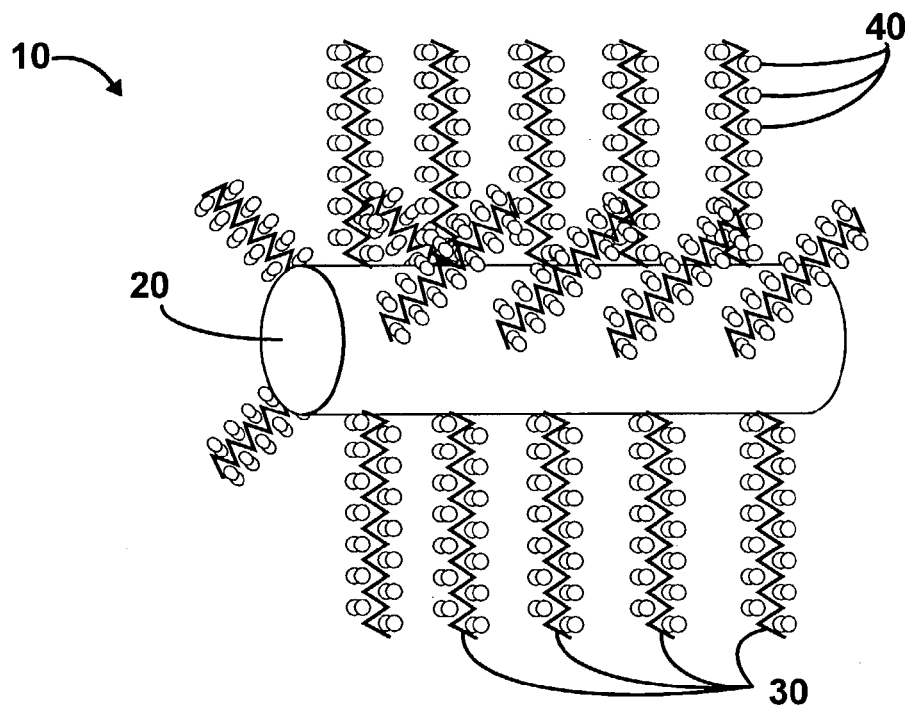
FIG. 1 is a schematic perspective view of a segment of an embodiment of a gas storage medium made in accordance with the invention.

FIG. 1 is a schematic perspective view of a segment of an embodiment of a gas storage medium 10 made in accordance with the invention and used for storing gas molecules. FIG. 1 illustrates the "tree-like" structure of a functionalized nanowire with physisorbed neutral hydrogen molecules: nanowire core 20 forms the "stem," organic molecules 30 attached to the exterior surface of the nanowire core form the "branches," and gas molecules 40, physisorbed on the organic molecules, form the "leaves." In the embodiment shown in FIG. 1, the molecules 30 extend generally radially outward from the exterior surface of the nanowire. The "zig-zag" shape depicted in FIG. 1 to illustrate organic molecules 30 is intended only as a convenient schematic representation of organic molecules and is not intended to represent the actual configuration or conformation of any particular molecule. Those skilled in the art will recognize that suitable organic molecules 30 can have many possible configurations and conformations.

Nanowire 20 may comprise any material that may be functionalized by chemical attachment of organic molecules 30, such as silicon, and combinations of such materials. For specificity and simplicity of the following description, it will be assumed that the nanowire is a silicon nanowire (abbreviated SiNW), but many other nanowire materials are suitable, including some that have not yet been discovered and/or that have not yet been made in nanowire form. Those skilled in the art will recognize that the methods of the present invention may be applied to any such nanowire materials that may be functionalized by chemical attachment of organic molecules 30.

Silicon nanowires (SiNW) suitable for the present invention may be grown in a conventional chemical vapor deposition process. An advantage of SiNW over carbon nanotubes, for example, is that SiNW are more chemically active. That is, SiNW can be functionalized on their sides with many types of molecules, using the conventional known methods of silicon chemistry. In this way, the surface of the entire gas storage medium increases many times. It is the surface of the organic-molecule "branches," not only the surface of the "stem" nanowire, that is used to physisorb gas molecules such as neutral hydrogen molecules. The hydrogen molecules are adsorbed at the surface of the alkane chains if alkane chains are used for the organic molecule "branches." Classes of organic molecules that can be used as "branches" include but are not limited to linear alkanes, branched alkanes, cycloalkanes, substituted alkanes, linear alkenes, branched alkenes, cycloalkenes, substituted alkenes, linear alkynes, branched alkynes, cycloalkynes, and substituted alkynes.

Some examples of suitable alkanes are: $-(CH_2)_n-CH_3$, $-(CH_2)_n-C-((CH_2)_m-CH_3)_3$, $\equiv Si-(CH_2)_n-CH_3$, $\equiv Si-(CH_2)_n-C-((CH_2)_m-CH_3)_3$, $(-O)_3 \equiv Si-R$, and/or their combinations and subcombinations, where R denotes an alkane and where the triple bond of the Si is denoted by "$\equiv$." Similarly, some examples of suitable alkenes are $-(CH_2)_n-C=C-(CH_2)_m-CH_3$, $-(CH_2)_n-C=C-(CH_2)_m-C-CH_3$, $-(CH_2)_m-C=C-(CH_2)_k-CH_3$, $-(CH_2)_n-C=C-((CH_2)_m-CH_3)_3$, and/or their combinations and subcombinations, where the double C—C bonds are denoted by "=." Similarly, some examples of alkynes are —$(CH_2)_n$—C≡C—$(CH_2)_m$—$CH_3$, —$(CH_2)_n$—C≡C—$CH_2$—$CH_2$=$CH_2$—$(CH_2)_m$—C≡C—$CH_3$, —$(CH_2)_n$—C≡C—(($CH_2)_m$—$CH_3)_3$, and/or their combinations and subcombinations, where the triple C—C bond is denoted by "≡." In all of these examples, n, m, and k are positive integers.

A useful figure of merit for gas storage media is the capacity, conventionally expressed as maximum weight percentage of gas stored. The weight percentage capacity varies with the molecular weight of the gas to be stored. For storage of hydrogen, for example, a useful capacity goal is 6.5 weight percent. The storage capacity of a gas storage medium made in accordance with the present invention may be enhanced by using organic molecules that are substantially linear. Linear alkanes are suitable molecules for such embodiments.

Molecules that attach to the exterior surface of the nanowire core at one of their ends and extend generally radially outward from the surface of the nanowire are useful for this application. The organic molecules 30 hold the gas molecules 40 by physisorption, i.e., adsorption in which the adsorbed substance is held by Van der Waals forces. Thus, gas molecules 40 are releasably held, and the gas may be released (desorbed), e.g., by application of heat.

The entire storage medium may be made of a large pile of functionalized SiNW. Because of the random orientation of individual SiNW, the medium has enough porosity to allow fast diffusion of gas molecules, especially for hydrogen, and short in-and-out gas delivery times. The storage efficiency of the described medium improves with decreasing nanowire radius, increasing nanowire length, increasing coverage of the functionalized surface, and increasing length of the attached molecules.

A fuel cartridge may be made, comprising a suitable container holding a gas storage medium made in accordance with the present invention. The container should be leak-free, chemically inert to the gas to be stored, and sufficiently robust (with a safety factor) to withstand the maximum pressure of the gas introduced and released from the gas storage medium. The interior volume preferably provides capacity for many such gas storage media, i.e., multiple nanowire cores, each having multiple organic molecules attached to their exterior surfaces for releasably holding the gas molecules.

A fuel cell may be made comprising gas storage media made in accordance with the present invention, either in a separate fuel chamber as described above or in a fuel chamber integral with the active portion of the fuel cell. Such a fuel chamber capable of efficiently storing hydrogen gas molecules is very useful for a fuel cell using hydrogen as its fuel.

An electronic device may be made comprising a gas storage medium of the present invention, e.g., by incorporating a fuel cell as described in the previous paragraph as the source of power for the electronic device. Similarly, an electronic device that controls a supply of gas for any purpose, such as chemical analysis or synthesis, may also benefit from incorporation of a gas storage medium made in accordance with the invention.

In accordance with another aspect of the invention, a general method is provided for making a gas storage medium by starting with a nanowire made of a suitable material for the core 20 and by attaching a number of suitable organic molecules 30 to the exterior surface of the nanowire core to releasably hold the gas molecules by physisorption. As described hereinabove, a suitable material for the nanowire core is silicon.

Again, the method embodiment illustrated in this section uses a silicon nanowire (SiNW) as the nanowire core. As described hereinabove, this method may be enhanced by using organic molecules that are substantially linear, in order to increase the storage capacity of the gas storage medium. Linear alkanes are molecules suitable for such embodiments of the method. As described hereinabove, some examples of suitable alkane chains (including silano-alkanes) are —$(CH_2)_n$—$CH_3$, —$(CH_2)_n$—C—(($CH_2)_m$—$CH_3)_3$, ≡Si—$(CH_2)_n$—$CH_3$, ≡Si—$(CH_2)_n$—C—(($CH_2)_m$—$CH_3)_3$, (—O)$_3$≡Si—R, and/or their combinations and subcombinations, where n and m are positive integers, and R denotes an alkane. Some examples of suitable alkenes and alkynes are listed hereinabove as well.

In this general method, the organic molecules 30 or their precursors may advantageously have a hydrolyzable group. If necessary to prepare the exterior surface of the nanowire core 20 to receive the organic molecules 30, the exterior surface of the nanowire may be oxidized. The organic molecules 30 or their precursors are introduced and hydrolyzed. The hydrolyzed organic molecules or the hydrolyzed precursors are condensed on the exterior surface of the nanowire core. Hydrogen bonding of the organic molecules and surface bond formation occur to attach the organic molecules 30 to the exterior surface of the nanowire 20.

Figure 2A:
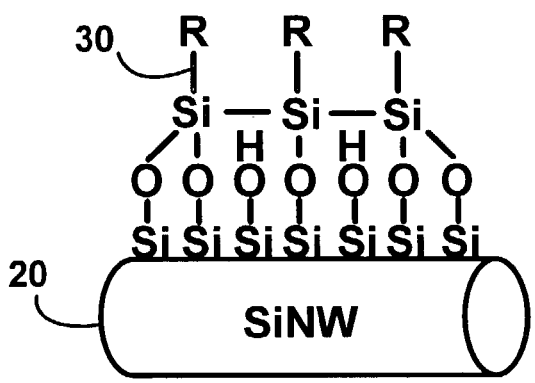
FIGS. 2A and 2B are composite diagrams schematically illustrating various embodiments of a gas storage medium made in accordance with the invention.
Figure 2B:
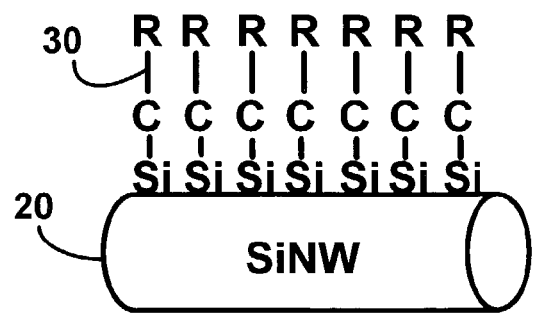

FIGS. 2A and 2B are composite diagrams schematically illustrating various embodiments of a gas storage medium made in accordance with the invention. The embodiments shown in FIGS. 2A and 2B use a silicon nanowire (SiNW) as the nanowire core 20, and the organic molecules 30 attached to its exterior surface after functionalization may be a linear alkane, branched alkane, cycloalkane, substituted alkane, linear alkene, branched alkene, cycloalkene, substituted alkene, linear alkyne, branched alkyne, cycloalkyne, or substituted alkyne, for example. In FIG. 2A, the exterior surface of silicon nanowire 20 has been oxidized and the resultant oxidized surface functionalized. Oxygen atoms (O) are bonded to surface Si atoms, and the silicon ends of the silano-alkane or other suitable molecules are bonded to the oxygen atoms. In FIG. 2B, the organic molecules 30 are bonded directly to the exterior surface of un-oxidized silicon, an end carbon atom (C) bonding to a surface silicon atom Si. Various moieties R may terminate the other ends of organic molecules 30, as shown in FIGS. 2A and 2B. Those skilled in the art will recognize that organic molecules 30 suitable for holding gas molecules may have many possible configurations and conformations.

Various specific methods for functionalizing silicon surfaces are known to those skilled in the art. Some such methods are described in U.S. Pat. Nos. 6,331,329 and 6,524,655 to McCarthy et al., and in U.S. Pat. No. 6,358,613 to Buriak, the entire disclosure of each of which is incorporated herein by reference. Other know functionalization methods are described in the book by Ulman, "An introduction to ultrathin organic films: from Langmuir-Blodgett to self-assembly" Academic Press, Boston (1991), in published international patent applications WO99/37409 and WO00/26019 of Purdue Research Foundation and Buriak, in the article by Buriak et al., "Lewis acid mediated functionalization of porous silicon with substituted alkenes and alkynes," Journal of the American Chemical Society, vol. 120 (February 1998), pp. 1339–1340, and in the article by Buriak, "Organometallic chemistry on silicon surfaces: formation of functional monolayers bound through Si—C bonds," Chemical Communications (1999), pp. 1051–1060.

According to another aspect of the invention, a method is provided for using a nanowire for storage of gas molecules, by attaching to the exterior surface of the nanowire a number of organic molecules adapted to releasably hold the gas molecules, physisorbing gas molecules onto the organic molecules for storage, and releasing the gas molecules from the organic molecules when the gas molecules are needed. In order to physisorb the gas molecules onto the organic molecules, a flow of the gas at a suitable pressure and temperature is provided, and the nanowire and organic molecules are exposed to the flow of gas. The gas molecules are released from the organic molecules by providing an exhaust path at a suitable pressure and temperature and heating the organic molecules if necessary to release the gas. In some applications, heating of the organic molecules may be performed by passing electric current through the nanowire.

Thus, both a high-capacity storage medium for gas molecules and specially adapted methods for using nanowires in gas storage are provided. There are many advantages of the gas storage medium and associated methods over previously available media and methods: the high capacity due at least in part to the extremely large surface-to-volume ratio, the lack of requirements for high pressures or cryogenic temperatures, fast diffusion of gas molecules due at least in part to high porosity, relatively light weight of the gas storage medium, and improved binding of the gas molecules due to charge distribution on the ionic organic molecules.

INDUSTRIAL APPLICABILITY

The gas storage medium and specially adapted methods of the present invention may be used to store hydrogen for the needs of fuel cells and other apparatus using hydrogen fuel and/or to store many other gases. Functionalized nanowires made in accordance with the invention may be used to store gases with high storage capacity.

Although the foregoing has been a description and illustration of specific embodiments of the invention, various modifications and changes thereto can be made by persons skilled in the art without departing from the scope and spirit of the invention as defined by the following claims. For example, for some applications, nanostructures having other shapes, such as nanotubes, nanospheres, nanoneedles, and nanocrystals may be used in place of the nanowires described hereinabove. Other materials having suitable properties may be substituted for the particular materials disclosed, and the order of steps in the methods employed may sometimes be varied.

The invention claimed is:

1. A fuel cartridge comprising a storage medium for gas molecules, including:
   a) a nanowire core having an exterior surface; and
   b) a plurality of organic molecules, each organic molecule having one or more functional groups attached thereto, the plurality of organic molecules being attached to the exterior surface of the nanowire core, and the one or more funcitonal groups being adapted to releasably hold the gas molecules.

2. A fuel cell comprising a storage medium for gas molecules, including:
   a) a nanowire core having an exterior surface; and
   b) a plurality of organic molecules, each organic molecule having one or more functional groups attached thereto, the plurality of organic molecules being attached to the exterior surface of the nanowire core, and the one or more functional groups being adapted to releasably hold the gas molecules.

3. A fuel cartridge comprising a storage medium for hydrogen gas molecules, including:
   a) a nanowire core having an exterior surface; and
   b) a plurality of organic molecules, each organic molecule having one or more functional groups attached thereto, the plurality of organic molecules being attached to the exterior surface of the nanowire core, the one or more functional groups being adapted to releasably hold the hydrogen gas molecules, and the one or more functional groups being selected from the list including linear alkanes, branched alkanes, cycloalkanes, substituted alkanes, linear alkenes, branched alkenes, cycloalkenes, substituted alkenes, linear alkynes, branched alkynes, cycloalkynes, substituted alkynes, and combinations thereof.

4. A fuel cell comprising a storage medium for hydrogen gas molecules, including:
   a) a nanowire core having an extenor surface; and
   b) a plurality of organic molecules, each organic molecule having one or more functional groups attached thereto, the plurality of organic molecules being attached to the exterior surface of the nanowire core, the one or more functional groups being adapted to releasably hold the hydrogen gas molecules, and the one or more functional groups being selected from the list inciuding linear alkanes, branched alkanes, cycloalkanes, substituted alkanes, linear alkenes, branched alkenes, cycloalkenes, substituted alkenes, linear alkynes, branched alkynes, cycloalkynes, substituted alkynes, and combinations thereof.

5. A method of making a fuel cartridge for storing gas molecules, the method comprising the steps of:
   a) providing a core comprising a nanowire having an exterior surface;
   b) attaching a plurality of organic molecules, each organic molecule having one or more functional groups attached thereto to the exterior surface of the nanowire, the one or more functional groups being adapted to releasably hold the gas molecules; and
   c) providing a container having an interior volume, the core and the plurality of organic molecules and the attached functional groups being disposed within the interior volume of the container.

6. The method of claim 5, wherein the nanowire comprises silicon.

7. The method of claim 5, wherein the one or more functional groups comprise functional groups selected from the list consisting of linear alkanes, branched alkanes, cycloalkanes, substituted alkanes, linear alkenes, branched alkenes, cycloalkenes, substituted alkenes, linear alkynes, branched alkynes, cycloalkynes, substituted alkynes, and combinations thereof.

8. A fuel cartridge comprising a storage medium made by a method comprising the steps of:
   a) providing a core comprising a nanowire having an exterior surface;
   b) attaching a plurality of organic molecules to the exterior surface of the nanowire, each organic molecule having one or more functional groups attached thereto, the functional groups being adapted to releasably hold the gas molecules.

9. A fuel cell comprising a storage medium made by a method comprising the steps of:
   a) providing a core comprising a nanowire having an exterior surface;
   b) attaching a plurality of organic molecules to the exterior surface of the nanowire, each organic molecule having one or more functional groups attached thereto, the functional groups being adapted to releasably hold the gas molecules.

10. A method of using a nanowire comprising silicon having an exterior surface adapted for storage of gas molecules, the method comprising the steps of:
   a) physisorbing gas molecules onto the exterior surface adapted for storage; and
   b) releasing the gas molecules from the exterior surface adapted for storage when the gas molecules are needed.

11. A method of using a nanowire having an exterior surface for storage of gas molecules, the method comprising the steps of:
   a) attaching to the exterior surface of the nanowire a plurality of organic molecules, each organic molecule having one or more functional groups attached thereto to adapt the exterior surface of the nanowire for storage of gas molecules, the organic molecules or functional groups being adapted to releasably hold the gas molecules, wherein the organic molecules or precursors thereof have a hydrolyzable group and the step of attaching the plurality of organic molecules having one or more functional groups attached thereto comprises the substeps of:
      i) oxidizing the exterior surface of the nanowire if necessary to provide an oxide surface;
      ii) introducing and hydrolyzing the organic molecules or precursors thereof;
      iii) condensing the hydrolyzed organic molecules or precursors thereof on the oxide surface;
      iv) causing hydrogen bonding of the organic molecules; and
      v) causing bond formation to attach the plurality of organic molecules to the exterior surface of the nanowire;
   b) physisorbing gas molecules onto the exterior surface adapted for storage; and
   c) releasing the gas molecules from the exterior surface adapted for storage when the gas molecules are needed.

12. The method of claim 11, wherein the step of physisorbing the gas molecules onto the exterior surface adapted for storage comprises the substeps of:
   i) providing a flow of gas at a suitable pressure and temperature; and
   ii) exposing the nanowire and plurality of organic molecules having one or more functional groups attached thereto to the flow of gas.

13. The method of claim 11, wherein the step of releasing the gas molecules comprises the substeps of:
   i) providing an exhaust path at a suitable pressure and temperature; and
   ii) heating the exterior surface adapted for storage if necessary to release the gas.

14. The method of claim 13, wherein the step of heating the exterior surface adapted for storage if necessary to release the gas is performed by passing current through the nanowire.

15. A method of using a nanowire having an exterior surface adapted for storage of gas molecules, the method comprising the steps of:
   a) physisorbing gas molecules onto the exterior surface adapted for storage; and
   b) releasing the gas molecules from the exterior surface adapted for storage when the gas molecules are needed:
   wherein the exterior surface of the nanowire is adapted for storage of gas molecules by attaching a plurality of organic molecules to the exterior surface of the nanowire, each organic molecule having one or more functional groups attached thereto.

16. A process of storing neutral gas molecules, comprising:
   a) a step of physisorbing the neutral gas molecules on a storage medium comprising:
      i) a plurality of nanowires, each having an exterior surface, and
      ii) a plurality of organic molecules attached to the exterior surface of each nanowire, each organic molecule having one or more functional groups attached thereto, whereby each of the nanowires is functionalized, the functional groups being adapted to releasably hold the neutral gas molecules; and
   b) a step of desorbing the neutral gas molecules from the functional groups when the neutral gas molecules are needed.

17. The process of claim 16, wherein the step of desorbing the neutral gas molecules is performed by heating at least the functional groups.

18. The process of claim 16, wherein the storage medium further comprises a cartridge substantially surrounding and enclosing the plurality of nanowires and the plurality of organic molecules having one or more functional groups attached thereto.

19. The process of claim 16, wherein the storage medium with neutral gas molecules physisorbed forms a plurality of tree-like structures wherein:
   a) each nanowire forms a trunk-like element,
   b) the attached organic molecules having one or more functional groups attached thereto form branch-like elements, and
   c) the physisorbed neutral gas molecules form leaf-like elements.

20. A method of making a storage medium for gas molecules, the method comprising the steps of:
   a) providing a core comprising a nanowire having an exterior surface;
   b) attaching a plurality of organic molecules to the exterior surface of the nanowire, each organic molecule having one or more functional groups attached thereto, the functional groups being adapted to releasably hold the gas molecules,
   wherein the organic molecules or precursors thereof have a hydrolyzable group, and the step of attaching a plurality of organic molecules to the exterior surface of the nanowire comprises the substeps of:
      i) oxidizing the exterior surface of the nanowire if necessay to provide an oxide surface;
      ii) introducing and hydrolyzing the organic molecules or precursors thereof;
      iii) condensing the hydrolyzed organic molecules or precursors thereof on the oxide surface;
      iv) causing hydrogen bonding of the organic molecules; and
      v) causing bond formation to attach the plurality of organic molecules to the exterior surface of the nanowire.

* * * * *